(12) United States Patent
Klauk et al.

(10) Patent No.: US 7,390,703 B2
(45) Date of Patent: Jun. 24, 2008

(54) METHOD FOR THROUGH-PLATING FIELD EFFECT TRANSISTORS WITH A SELF-ASSEMBLED MONOLAYER OF AN ORGANIC COMPOUND AS GATE DIELECTRIC

(75) Inventors: Hagen Klauk, Erlangen (DE); Marcus Halik, Erlangen (DE); Ute Zschieschang, Erlangen (DE); Guenter Schmid, Hemhofen (DE); Stefan Braun, Willich (DE)

(73) Assignee: Infineon Technologies, AG, Neubiberg (DE)

( * ) Notice: Subject to any disclaimer, the term of this patent is extended or adjusted under 35 U.S.C. 154(b) by 327 days.

(21) Appl. No.: 11/062,766

(22) Filed: Feb. 22, 2005

(65) Prior Publication Data
US 2005/0186700 A1   Aug. 25, 2005

(30) Foreign Application Priority Data
Feb. 23, 2004   (DE) ................. 10 2004 008 784

(51) Int. Cl.
*H01L 21/00* (2006.01)
*H01L 21/84* (2006.01)
*H01L 51/40* (2006.01)

(52) U.S. Cl. .............. 438/158; 438/99; 257/E21.414; 257/E51.007

(58) Field of Classification Search .......... 438/99, 438/158; 257/E51.007
See application file for complete search history.

(56) References Cited

U.S. PATENT DOCUMENTS 4,716,071 A * 12/1987 Roberts et al. ............ 428/209
6,143,653 A * 11/2000 Tsai et al. ................. 438/669
6,436,775 B2 * 8/2002 Kim et al. ................. 438/301
6,660,650 B1 * 12/2003 Konecni et al. ........... 438/720
2002/0137284 A1 * 9/2002 Chang et al. .............. 438/257
2003/0000732 A1 * 1/2003 Emery .................... 174/137 R (Continued)

FOREIGN PATENT DOCUMENTS

DE         198 15 220 C2        9/1999

(Continued)

OTHER PUBLICATIONS

Rampi, M. A.; Schuller, O. J. A.; Whitesides, G. M. "Alkanethiol self-assembled monolayers as the dielectric of capacitors with nanoscale thickness" Appl. Phys. Lett. 1998. 72, 1781.*

(Continued)

*Primary Examiner*—Carl Whitehead, Jr.
*Assistant Examiner*—Daniel Luke
(74) *Attorney, Agent, or Firm*—Edell, Shapiro & Finnan, LLC

(57) ABSTRACT

A method for through-plating field effect transistors with a self-assembled monolayer of an organic compound as gate dielectric includes through-plating by patterning a gate electrode material, and bringing an organic compound having dielectric properties into contact with the contact hole material and the gate electrode material. A contact hole material and the gate electrode material are at least partially uncovered. The contact hole is material not identical to the gate electrode material. A self-assembled monolayer of the organic compound is formed above the gate electrode material. The method also includes depositing and patterning the source and drain contacts without removing the self-assembled monolayer of the organic compound, and depositing a semiconductor material.

15 Claims, 3 Drawing Sheets

U.S. PATENT DOCUMENTS

2003/0102518 A1* 6/2003 Fried et al. .................. 257/401
2003/0136964 A1* 7/2003 Afzali-Ardakani et al. .... 257/72
2004/0161873 A1* 8/2004 Dimitrakopoulos et al. ... 438/99
2006/0243965 A1* 11/2006 De Leeuw et al. ............ 257/40

FOREIGN PATENT DOCUMENTS

WO     WO 03/023877 A2    3/2003

OTHER PUBLICATIONS

C.R. Kagan, et al., "Patterning organic-inorganic thin-film transistors using microcontact printed templates;" 2001 American Institute of Physics; pp. 3536-3538.

* cited by examiner

Step 3: Monolayer
(for example phosphonic acid)

Step 2: Contact hole
(for example gold)

Step 1: Gate electrode
(for example aluminium)

Step 5: Semiconductor layer

Step 4: Source/Drain contacts

METHOD FOR THROUGH-PLATING FIELD EFFECT TRANSISTORS WITH A SELF-ASSEMBLED MONOLAYER OF AN ORGANIC COMPOUND AS GATE DIELECTRIC

CROSS REFERENCE TO RELATED APPLICATIONS

This application claims priority under 35 USC §119 to German Application No. DE 10 2004 008 784.9, filed on Feb. 23, 2004, and titled "Method for the Through-Plating of Field Effect Transistors with a Self-Assembled Monolayer of an Organic Compound as Gate Dielectric," the entire contents of which are hereby incorporated by reference.

FIELD OF THE INVENTION

The present invention relates to organic field effect-transistors, and more particularly, to a method for through-plating field effect transistors.

BACKGROUND

Field effect transistors based on organic semiconductors are of interest for electronic applications that require extremely low production costs, flexible, or unbreakable substrates, or fabrication of transistors and integrated circuits over large areas. For example, organic field transistors are used as pixel control elements in active matrix screens. Such screens are usually produced with field effect transistors based on amorphous or polycrystalline silicon layers. Temperatures of more than 250° C. are usually necessary for fabricating high-quality transistors based on amorphous or polycrystalline silicon layers require the use of rigid unbreakable glass or quartz substrates. Due to the relatively low temperatures at which transistors based on organic semiconductors are fabricated, e.g., usually less than 200° C., organic transistors permit production of active matrix screens using inexpensive, flexible, transparent, unbreakable polymer films with considerable advantages over glass or quartz substrates.

Another application for organic field effect transistors is fabrication of very inexpensive integrated circuits used, for example, for active labeling and identification of merchandise and goods. These transponders are usually produced using integrated circuits based on monocrystalline silicon, which leads to considerable costs in the construction and connection technology. Producing transponders based on organic transistors leads to enormous cost reductions and assists in increasing transponder technology en route to a worldwide breakthrough.

The fabrication of thin-film transistors usually requires a large number of steps in which the different layers of the transistor are deposited. In a first step, the gate electrode is deposited on a substrate, then the gate dielectric is deposited on the gate electrode, and the source and drain contacts are deposited and then patterned. Finally, the semiconductor is deposited between the source and drain electrodes on the gate dielectric.

Efforts to simplify the fabrication process for field effect transistors and to fabricate the field effect transistors with smaller dimensions have been made. Fabrication of organic field effect transistors requires a targeted patterning of the gate dielectric layer since the targeted access necessary for operation of the transistors to the electrodes or contacts in the metallization plane or the metallization planes below an insulating layer of a substrate (i.e., the substrate in which the transistors are formed) are produced by through-plating (also referred to as contact hole or "via") in the insulating layer. An access to the metallization planes situated below the insulating layer is necessary, if the input of one transistor is to be linked to the output of another transistor, as is necessary in many cases in almost every integrated circuit.

In recent years, a plurality of microelectronics elements have been described which have a size of a few nanometers and require no lithographic methods or fewer lithographic steps to be fabricated. These elements are nanoelements fabricated by nanotechnology. The elements have a self-assembled molecular layer (self-assembled monolayer).

When using conventional gate dielectrics, such as silicon oxide and aluminum oxide, for example, the contact holes are opened after deposition of the initially closed dielectric layer. For patterning the gate dielectric, a photoresist is applied, exposed, and developed. Then, the gate dielectric is removed by an etching process in regions of the envisaged contact holes. The photoresist protects the regions that are not to be etched. Finally, the photoresist mask is again removed.

This method is unsuitable for patterning molecular self-assembled monolayers. Photoresists are generally developed in a basic solution, which leads to destruction of the monolayer. Coating monolayers with resist is difficult due to strongly hydrophobic nature of many self-assembled monolayers.

SUMMARY

A method for through-plating field effect transistors having a self-assembled monolayer arranged on the gate electrode and serving as a gate dielectric includes patterning a gate electrode material to form a contact hole for through-plating the gate electrode, depositing of an organic compound having dielectric properties above the contact hole material and the gate electrode material, depositing and patterning the source and drain contacts without removing the self-assembled monolayer, and depositing a semiconductor material. The contact hole material and the gate electrode material are at least partly uncovered. The contact hole material is not identical to the gate electrode material. A self-assembled monolayer of the organic compound is formed selectively above the gate electrode material. The through plating of field effect transistors is simplified and compatible with conventional lithographic techniques.

In the method according to the invention, the self-assembled monolayer serving as a gate dielectric is processed such that providing plated-through holes is effected as early as during deposition of the monolayer and renders subsequent patterning of the monolayer superfluous, by using the selectivity of the absorption of molecular monolayers in dependence on configuration of the substrate surface. The molecular monolayer is formed only above the gate electrode material and not above the contact hole material. This is possible because many metals have a native oxide layer that can be used for the selectivity. No absorption of the organic compounds then occurs on noble metals since noble metals do not have a metal oxide layer necessary for formation of the self-assembled monolayer. Through the targeted selection of the gate electrode material, the contact hole material and the organic compound materials are selected so that self-assembled monolayer is formed only above the gate electrode material.

If, for example, the gate electrode material is selected from the group consisting of aluminum (Al), titanium (Ti), titanium nitride (TiN), tantalum (Ta), tantalum nitride (TaN), tungsten (W), titanium tungsten (TiW), tantalum tungsten (TaW), tungsten nitride (WN), tungsten carbonitride (WCN), iridium oxide (IrO), ruthenium oxide (RuO), and strontium ruthenium oxide (SRuO), the contact material may be selected from the group of the noble metals, such as, for example, gold (Au), platinum (Pt), palladium (Pd), silver (Ag), and from gallium arsenide and indium phosphide. In this case, a self-assembled monolayer of an organic compound selected from the group of the phosphonic acid derivatives may be used as the gate dielectric since the phosphonic acid derivatives adsorb on the surface of the base, natively oxidized metals and not on the surface of the noble metals (i.e., the phosphonic acid derivatives adsorb in a targeted manner in that these compounds adsorb on the surface of the natively oxidized metals and not on the surface of the noble metals). Since the surfaces of the gate electrode material and of the contact hole material are partly uncovered, during the self-assembly of the organic compound, a self-assembled monolayer is formed on the gate electrode material, whereas no self-assembled monolayer is formed above the contact hole material.

In an exemplary implementation of the invention,;the gate electrode material and the contact hole material are selected from the materials mentioned above.

However, it is also possible for the contact hole material to be selected from the group consisting of aluminum (Al), titanium (Ti), titanium nitride (TiN), tantalum (Ta), tantalum nitride (TaN), tungsten (W), titanium tungsten (TiW), tantalum tungsten (TaW), tungsten nitride (WN), tungsten carbonitride (WCN), iridium oxide (IrO), ruthenium oxide (RuO), and strontium ruthenium oxide (SRuO). In this case, the material of the gate electrode is selected from the group consisting of noble metals, such as, for example, gold (Au), platinum (Pt), palladium (Pd), and silver (Ag), and from gallium arsenide and indium phosphid. In this case, the self-assembled monolayer of the organic compound is intended to have groups that form a self-assembled monolayer in a targeted manner on the surface of the noble metals and not on the surface of the base metals. Such an organic compound may, for example, have radicals selected from the group consisting of SH, OH, $NH_2$, NHR, $NR_2$, COOH, $CONH_2$, CN, CONHOH, $CONHNH_2$ or $PR_2$. In an embodiment of the invention, the gate electrode material is selected from the group of noble metals and from gallium arsenide and indium phosphide.

Even though metal oxide is mentioned as a preferred embodiment as the possibility for obtaining selectivity, other groups having a selectivity with respect to an organic compound may also be introduced through a targeted treatment of the gate electrode material. Such a treatment is possible, for example, if the gate electrode material includes silicon. Silicon can then be treated in such a way that different groups that interact with an organic compound are present at the surface, so that the self-assembled monolayer is formed only above the gate electrode material. Silicon may then have groups, such as, for example, —H, —OH, or —$NH_2$.

In a particular embodiment, however, a metal oxide layer is preferred since this layer is already present or is relatively easy to fabricate in the case of many non-noble metals.

However, if the gate electrode material is selected from the group of the noble metals as described above, the contact hole material has a metal oxide layer, so that an organic compound having SH groups, for example, is formed only on the surface of the noble metal.

The organic compound that forms a self-assembled monolayer above the gate electrode material can be selected from a multiplicity of compounds. Selectivity between the gate electrode material and the contact hole material is a precondition. For example, the organic compound may have a radical selected from the group consisting of R—$SiCl_3$, R—$SiCl_2$alkyl, R—SiCl(alkyl)$_2$, R—Si(OR)$_3$, R—Si(OR)$_2$ alkyl, R—SiOR(alkyl)$_2$, R—PO(OH)$_2$, R—CHO, R—CH=$CH_2$, R—SH, R—OH, R—$NH_2$, R—COOH, R—$CONH_2$, R—CONHOH, R—$CONHNH_2$, and R—CN, where R may be an arbitrary group, and in particular, an n-alkyl, n-alkyl ether, a linear aromatic group of the formula —($C_6H_4$)n—, where the alkyl and alkyl ether groups have between 4 and 40 C. atoms and n is an integer between 2 and 6.

Since, as gate electrode material, metals which have either a native metal oxide layer or a metal oxide layer that can easily be fabricated are conventionally selected from the group, such as aluminum or titanium, for example, in a preferred embodiment the organic compound has a group selected from R—PO(OM)$_2$, where R has the above meaning. M may be either H, a metal or an arbitrary organic group.

The material for the source and drain contacts may be an arbitrary material and the selection is not critical for the present invention.

The semiconductor material may be both of inorganic and of organic nature. In a preferred embodiment, however, the semiconductor material is an organic polymer.

In the preferred embodiment, the organic polymer is selected from the group consisting of pentacene, tetracene and polythiophene.

BRIEF DESCRIPTION OF THE DRAWINGS

The invention will now be explained in more detail with reference to the figures.

DETAILED DESCRIPTION

Figure 1C:
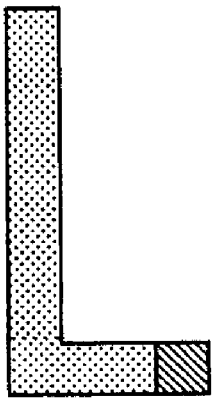
FIGS. 1A-1E show the process sequence for fabricating an organic field effect transistor with a molecular self-assembled monolayer as gate dielectric.
Figure 1B:
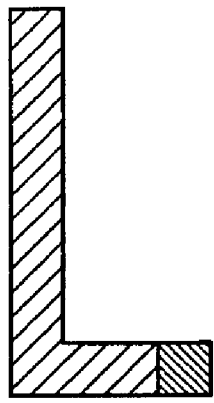
Figure 1A:
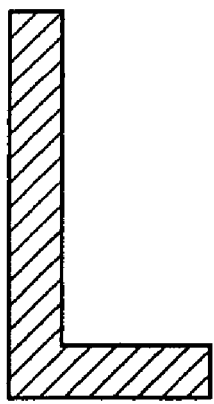
Figure 1E:
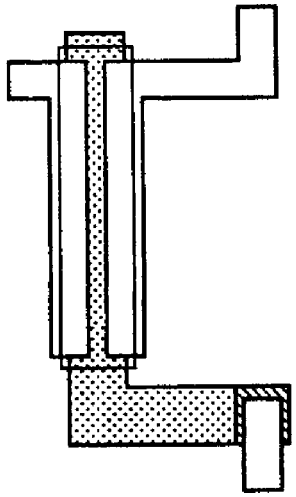
Figure 1D:
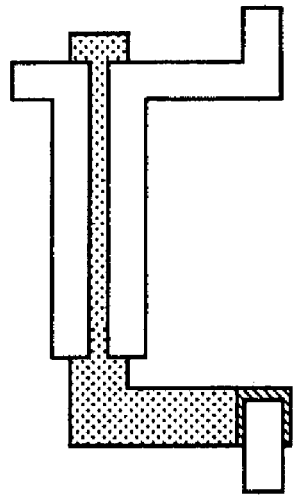

FIGS. 1A-1E show top views of a gate electrode that can be fabricated from the gate electrode material according to the invention. The structure illustrated in FIG. 1B is obtained after patterning the contact hole and depositing the contact hole material. The gate electrode material and the contact hole material simultaneously contact an organic compound. A self-assembled monolayer of the organic compound is formed selectively above the gate electrode material (and not above the contact hole material) (FIG. 1C). The self-assembled monolayer of the organic compound serves as gate dielectric, so that the source and drain contacts are deposited and patterned without using a photomask for patterning the gate dielectric. The result is illustrated in FIG. 1D. Finally, a semiconductor is deposited in order to attain the structure illustrated in FIG. 1E.

It is possible to first define the metal for the gate electrode and then to define the metal for the contact holes, or, conversely, to first define the metal for the contact holes and then define the metal for the gate electrodes. The contact hole material needs to be at least partially uncovered after defining of the gate electrode material.

Figure 2A:
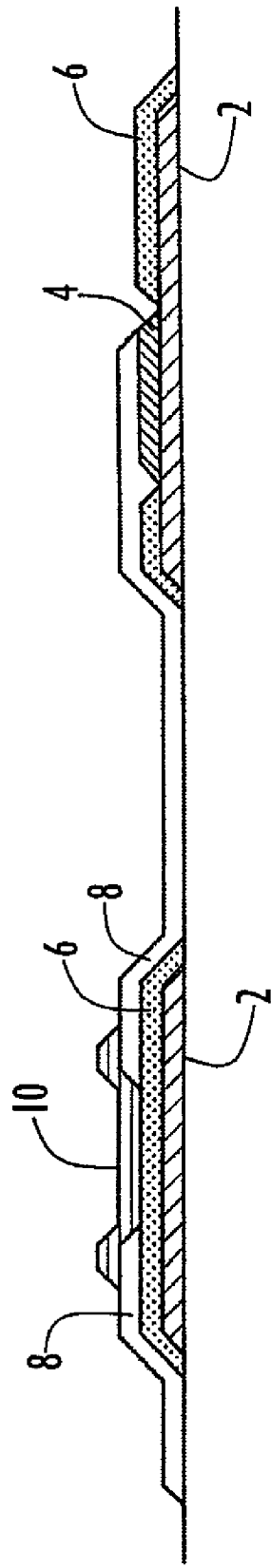
FIGS. 2A and 2B show a schematic cross section of an organic field effect transistor and a contact hole, fabricated in accordance with the method according to the invention.
Figure 2B:
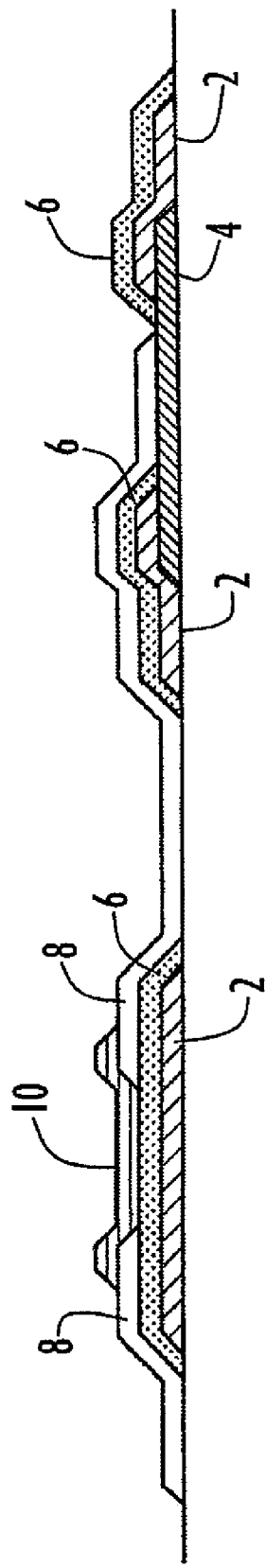

FIGS. 2A and 2B illustrate schematic cross-sections of an organic field effect transistor (left) and of a contact hole (right), which are fabricated using the method according to the invention, where metal portions 2 forming the gate electrodes, metal portions 4 for the contact holes, organic monolayer portions 6, source/drain contact regions 8, and semiconductor material 10 are shown. In the arrangement shown in FIG. 2A, the metal portions 2 for the gate electrodes were first defined and then the metal portions 4 for the contact holes were defined. In the arrangement shown in FIG. 2B, the metal portions 4 for the contact holes were defined first and then the metal portions 2 for the gate electrodes were defined.

EXAMPLE

A layer of aluminum having a thickness of 20 nm is vapor-deposited onto a glass substrate and patterned by photolithography and wet-chemical etching in a weakly basic solution in order to define the gate electrodes. A layer of gold having a thickness of 20 nm is then vapor-deposited and patterned by photolithography and wet-chemical etching in an iodine potassium iodide solution in order to define the contact holes. Afterward, the substrate is dipped into an alcoholic solution of the phosphonic acid derivative n-octadecyl phosphonic acid ($C_{18}H_{37}PO(OH)_2$) in order to produce the gate dielectric, a molecular monolayer is formed on the aluminum gate electrodes, not in the contact holes. A layer of gold with a thickness of 20 nm is subsequently deposited and patterned in order to produce the source and drain contacts. Finally, pentacene is vapor-deposited.

Figure 3A:
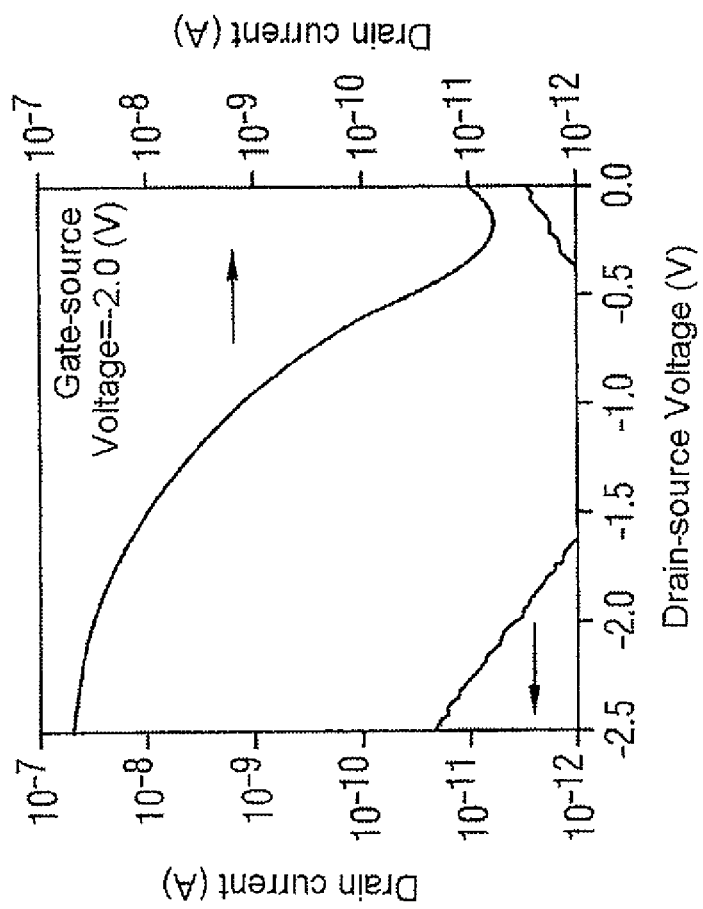
FIGS. 3A and 3B show current-voltage characteristic curves of a field effect transistor according to the invention.
Figure 3B:
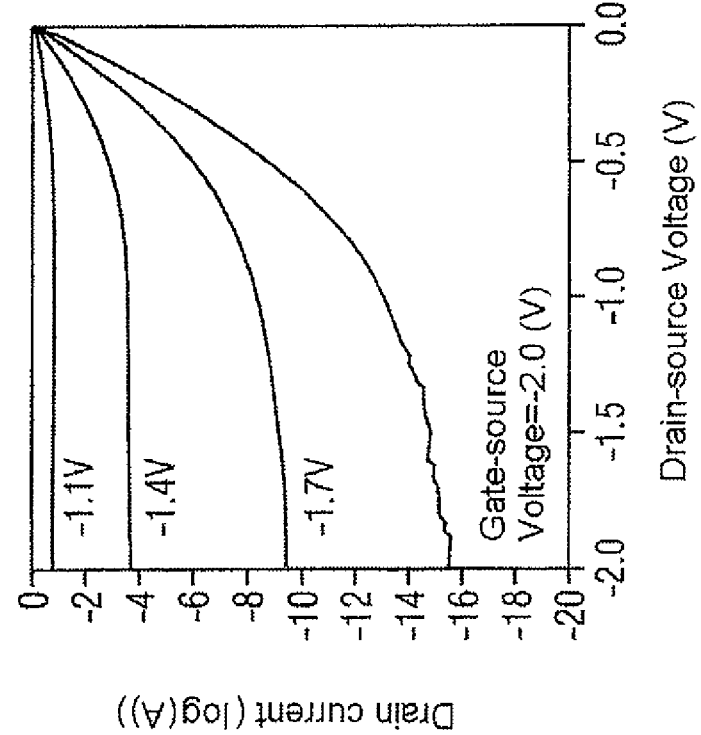

FIGS. 3A and 3B show the current-voltage characteristic curves of a pentacene transistor and the output signal of a five-stage pentacene ring oscillator which, as described above, are fabricated by the methods according to the invention.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for through-plating field effect transistors, comprising:
    patterning a gate electrode material in relation to a substrate to form a gate electrode at a first region of the substrate;
    depositing a contact hole material at a second region of the substrate separated from the first region such that the gate electrode is spaced from the contact hole material after deposition of the contact hole material, wherein the contact hole material is different from the gate electrode material;
    depositing an organic compound that is selective with respect to the gate electrode material in relation to the contact hole material so as to form a self-assembled monolayer that is located above the gate electrode material and that covers the gate electrode while leaving at least a portion of the contact hole material exposed, wherein the formed organic compound has dielectric properties;
    depositing and patterning source and drain contacts proximate the gate electrode without removing the self-assembled monolayer of the organic compound; and
    depositing a semiconductor material.

2. The method of claim 1, wherein the gate electrode material is selected from the group consisting of Al, Ti, TiN, Ta, TaN, W, TiW, TaW, WN, WCN, IrO, RuO, and SrRuO, and the contact hole material is selected from the group consisting of gallium arsenide, indium phosphide, Au, Pt, Pd, and Ag.

3. The method of claim 1, wherein the contact hole material is selected from the group consisting of Al, Ti, TiN, Ta, TaN, W, TiW, TaW, WN, WCN, IrO, RuO, and SrRuO, and the gate electrode material is selected from the group consisting of gallium arsenide, indium phosphide, Au, Pt, Pd, and Ag.

4. The method of claim 1, wherein the gate electrode material includes a metal oxide layer at a surface of the gate electrode material.

5. The method of claim 1, wherein the contact hole material includes a metal oxide layer at a surface of the contact hole material.

6. The method of claim 2, wherein the organic compound comprises a phosphonic acid derivative.

7. The method of claim 2, wherein the organic compound has the formula $R-PO(OM)_2$, where R is one of an n-alkyl, n-alkyl ether, and a linear aromatic group of the formula -$(C_6H_4)n$-, where the n-alkyl and n-alkyl ether groups have between 4 and 20 C atoms, n is an integer between 2 and 6 and M is one of H, metal and an organic radical.

8. The method of claim 1, wherein the semiconductor material is an organic polymer.

9. The method of claim 8, wherein the organic polymer is selected from the group consisting of pentacene, tetracene, and polythiophene.

10. The method of claim 2, wherein the gate electrode material includes a metal oxide layer at a surface of the gate electrode material.

11. The method of claim 3, wherein the contact hole material includes a metal oxide layer at a surface of the contact hole material.

12. The method of claim 1, wherein the organic compound includes a radical selected from the group consisting of $R-SiCl_3$, $R-SiCl_2$alkyl, $R-SiCl(alkyl)_2$, $R-Si(OR)_3$, $R-Si(OR)_2$ alkyl, $R-SiOR(alkyl)_2$, $R-PO(OH)_2$, $R-CHO$, $R-CH=CH_2$, SH, OH, $NH_2$, COOH, $CONH_2$, CONHOH, $CONHNH_2$, and CN, where R is one of an n-alkyl, n-alkyl ether and a linear aromatic group of the formula -$(C_6H_4)n$-, where the n-alkyl and n-alkyl ether groups have between 4 and 20 C atoms and n is an integer between 2 and 6.

13. The method of claim 3, wherein the organic compound includes a radical selected from the group consisting of SH, OH, $NH_2$, NHR, $NR_2$, COOH, $CONH_2$, CN, CONHOH, $CONHNH_2$, and $PR_2$, where R is one of an n-alkyl, n-alkyl ether and a linear aromatic group of the formula -$(C_6H_4)n$-, where the n-alkvl and n-alkvl ether groups have between 4 and 20 C atoms and n is an integer between 2 and 6.

14. The method of claim 4, wherein the organic compound has the formula $R-PO(OM)_2$, where R is one of an n-alkyl, n-alkyl ether and a linear aromatic group of the formula -$(C_6H_4)n$-, where the n-alkyl and n-alkyl ether groups have between 4 and 20 C atoms and n is an integer between 2 and 6 and M is one of H, metal, and an organic radical.

15. The method of claim 1, wherein the organic compound comprises a polythiophene.

* * * * *